(12) United States Patent
Blom

(10) Patent No.: US 8,766,672 B2
(45) Date of Patent: Jul. 1, 2014

(54) ELECTRONIC SWITCHING DEVICE

(75) Inventor: Anton Cornelis Blom, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/469,119

(22) Filed: May 11, 2012

(65) Prior Publication Data

US 2012/0293214 A1   Nov. 22, 2012

(30) Foreign Application Priority Data

May 19, 2011   (EP) ..................................... 11166778

(51) Int. Cl.
*H03K 3/00*   (2006.01)

(52) U.S. Cl.
USPC ........... 327/108; 327/432; 327/436; 327/542; 327/540

(58) Field of Classification Search
USPC .......................................................... 327/108
See application file for complete search history.

(56) References Cited

U.S. PATENT DOCUMENTS

| | | | | |
|---|---|---|---|---|
| 4,740,722 | A * | 4/1988 | Furuhata ........................ | 327/432 |
| 5,859,557 | A * | 1/1999 | Schley-May ................... | 327/333 |
| 6,091,276 | A * | 7/2000 | Aiello et al. ................... | 327/376 |
| 6,255,890 | B1 * | 7/2001 | Aiello et al. ................... | 327/432 |
| 6,509,727 | B2 * | 1/2003 | Fahrenbruch .................. | 323/316 |
| 6,653,891 | B1 * | 11/2003 | Hazucha ........................ | 327/540 |
| 7,019,580 | B1 * | 3/2006 | Michalski ...................... | 327/427 |
| 7,218,164 | B2 * | 5/2007 | Vitale et al. .................... | 327/376 |
| 7,701,279 | B2 * | 4/2010 | Scollo et al. ................... | 327/433 |
| 8,120,414 | B2 * | 2/2012 | Albean .......................... | 327/538 |
| 2005/0194623 | A1 * | 9/2005 | Scollo et al. .................... | 257/291 |
| 2007/0247879 | A1 * | 10/2007 | Yang ................................ | 363/49 |
| 2009/0085654 | A1 * | 4/2009 | Lin .................................. | 327/543 |
| 2009/0096511 | A1 * | 4/2009 | Ueunten ......................... | 327/543 |
| 2009/0140712 | A1 * | 6/2009 | Giombanco et al. ........... | 323/288 |
| 2010/0207450 | A1 * | 8/2010 | Ogawa et al. ................... | 307/43 |

FOREIGN PATENT DOCUMENTS

| | | |
|---|---|---|
| EP | 1 583 235 A1 | 10/2005 |
| FR | 2 607 642 A1 | 6/1988 |
| FR | 2607642 A1 * | 6/1988 |

OTHER PUBLICATIONS p. 398 Controllable definition, Webster's New Twentieth Century Dictionary Second Edition, Copyright 1983.*
Extended European Search Report for European Patent Appln. No. 11166778.8 (Dec. 19, 2011).

* cited by examiner

*Primary Examiner* — Lincoln Donovan
*Assistant Examiner* — Patrick Chen

(57) ABSTRACT

An electronic switching device comprises a first bipolar junction transistor (BJT) (2*a*) adapted to control the flow of current between a pair of switching terminals; a charge recovery circuit coupled to the base of the first BJT (2*a*) and adapted to establish a supply voltage across a capacitor (5) by storing in the capacitor (5) charge carriers accumulated in the base of the first BJT (2*a*) during application of a base drive current, the quantity of accumulated charge carriers depending on the base drive current; and a controllable current source (4) adapted to control the base drive current, thereby controlling the supply voltage.

11 Claims, 1 Drawing Sheet

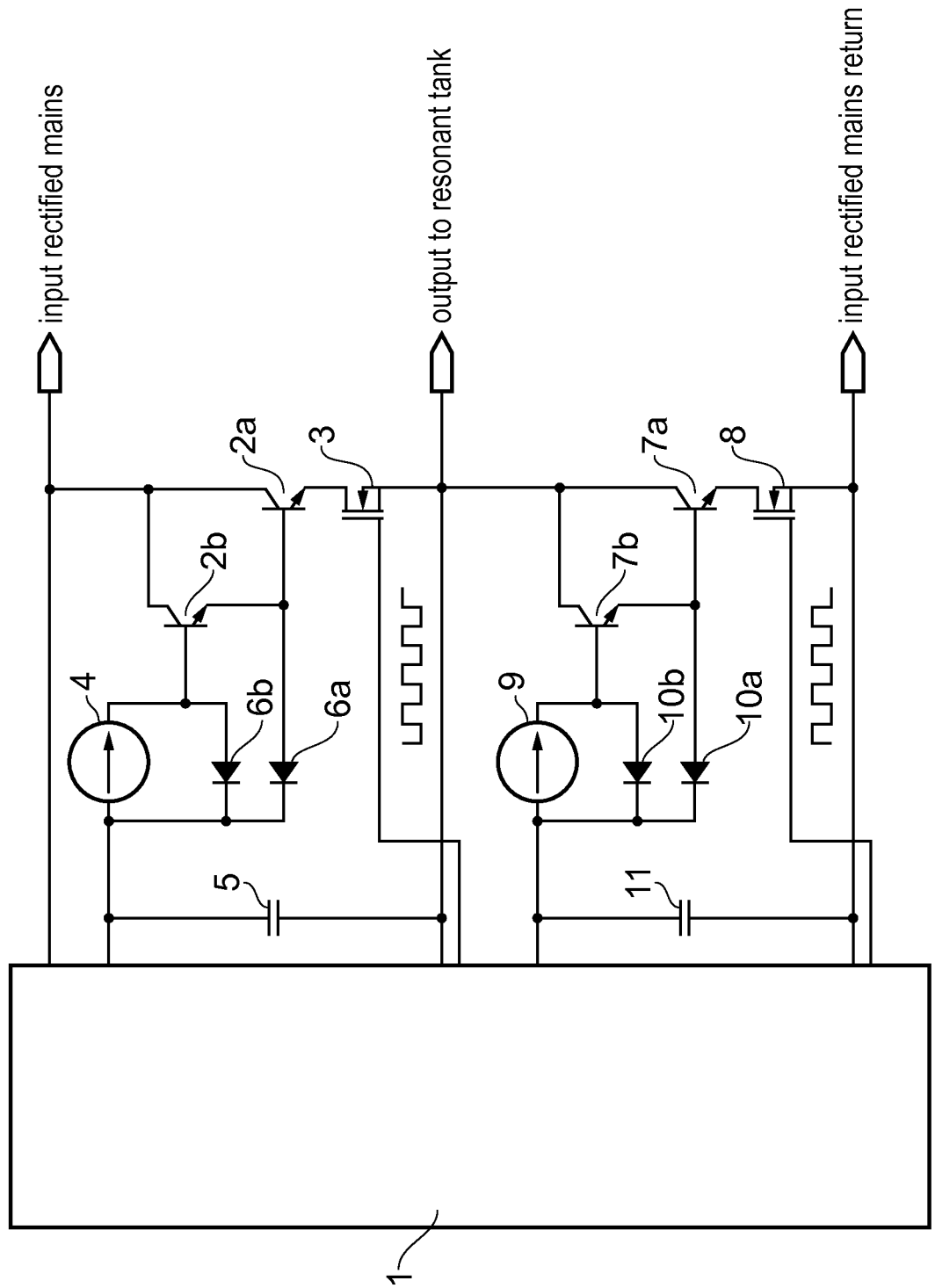

ELECTRONIC SWITCHING DEVICE

CROSS-REFERENCE TO RELATED APPLICATIONS

This application claims the priority under 35 U.S.C. §119 of European patent application no. 11166778.8, filed on May 19, 2011, the contents of which are incorporated by reference herein.

The invention relates to an electronic switching device comprising a bipolar junction transistor (BJT) adapted to control the flow of current between a pair of switching terminals.

In many applications, for example in switch mode power supplies, switching of electrical current is done by means of power MOSFETs. Power MOSFETs have favourable switching properties and driving power MOSFETs is straightforward. However, power MOSFETs show rather high losses when switched on. These losses can be reduced by using a larger chip area, but larger chip sizes result in an increased cost of the MOSFET.

For mains voltage applications or where the electronic switch requires a voltage rating of about 400V or higher, a bipolar junction transistor (BJT) can be a good alternative to a MOSFET. The chip size is by default much smaller than the chip size of a corresponding MOSFET. Some switching applications where BJTs are used in preference to MOSFETs are in flyback supplies, LLC (inductor-inductor-capacitor) supplies, preconditioning boost converters, and half-bridge lamp drivers, for example for compact fluorescent lamps (CFL).

Unfortunately, the current required for driving the base of a BJT is rather high when compared to the current required to drive a MOSFET's gate, and it is necessary to provide a dedicated, well-designed drive circuit for switching off a BJT. This is because all the free charge carriers in the base region of the BJT have to be removed before it is able to sustain a high voltage across its collector and emitter. Fast removal of the free charge carriers in the base region is achieved by a relative high negative base current. A higher negative current reduces the base discharge time. In fast switching applications, a high negative base discharge current is therefore unavoidable. In many applications this high negative base discharge current prevents the use of BJTs.

Another issue concerns the generation of the base drive current itself. This current has to be supplied by external circuitry. In practice, the drive currents required cannot be generated economically for mass production situations because the required base current requires large components, which results in high component costs.

This problem is exacerbated because the current transfer ratio of medium and high voltage transistors is rather limited. In many cases, the current transfer ratios as low as 10 (or even lower at high current densities) can be encountered, resulting in a base drive requirement of 10% or more of the collector current. The base drive circuit is therefore highly inefficient due to the level of the required base current.

The problem has been alleviated to a large extent by reusing charge stored in the base of the BJT. The excess charge carriers in the base are recovered when the BJT is switched off by using a current that flows from collector to base to charge a capacitor. The charge stored in the capacitor establishes a supply voltage, which can be used to drive the base of the BJT in subsequent switching cycles and for other purposes, such as providing power to control circuitry. The emitter switching topology combines the possibility of switching-off BJTs quickly with recovery of the base charge current. In emitter switching applications with one high voltage BJT, the required drive current is still higher than the current that is generated during the recovery part of the process, however.

Using a high voltage Darlington configuration, which is controlled by emitter switching, results in a significant reduction of the required base drive current. The recovered total base charge current of both high voltage transistors is in general much higher than the required base drive current for driving the first transistor.

However, this scheme presents its own problem: the supply voltage developed by storing the charge in the capacitor is unpredictable and uncontrolled. In practice, a Zener diode is provided to clamp the voltage, but this additional component adds cost and cannot be easily integrated. Furthermore, it leads to additional losses in the Zener diode.

According to the invention, there is provided an electronic switching device comprising a first bipolar junction transistor (BJT) adapted to control the flow of current between a pair of switching terminals; a charge recovery circuit coupled to the base of the first BJT and adapted to establish a supply voltage across a capacitor by storing in the capacitor charge carriers accumulated in the base of the first BJT during application of a base drive current, the quantity of accumulated charge carriers depending on the base drive current; and a controllable current source adapted to control the base drive current, thereby controlling the supply voltage.

By providing a controllable current source that can control the base drive current, it is possible to control the quantity of accumulated charge carriers in the base of the first BJT and hence, the supply voltage established across the capacitor. The supply voltage can therefore be maintained below a desired upper limit so that the requirement for a Zener diode is dispensed with. Furthermore, the controllable current source can be easily integrated at low cost in a controller integrated circuit.

The accumulated charge carriers are stored in the capacitor when the first BJT is switched off. At this time, a current flows from the base to the capacitor until all the charge stored in the base is dissipated.

Typically, the electronic switching device further comprises a MOSFET coupled in series with the first BJT between the pair of switching terminals.

Normally, the drain of the MOSFET is coupled to the emitter of the first BJT, and the collector of the first BJT and source of the MOSFET are connected to respective ones of the pair of switching terminals.

In a preferred embodiment, a control terminal is coupled to the gate of the MOSFET only, the control terminal being suitable for receiving a control signal for operating the electronic switching device.

The charge recovery circuit typically comprises a first diode coupled to conduct charge carriers present in the base of the first BJT when it is switched off to the capacitor.

Preferably, the electronic switching device further comprises a second BJT coupled with the first BJT to form a Darlington pair.

In the Darlington configuration, the base of the second high voltage bipolar transistor is typically also coupled to the charge recovery circuit. This results in the accumulated charge carriers in the base of the second BJT being stored in the capacitor when it is switched off.

Thus, the charge recovery circuit typically comprises a second diode coupled to conduct charge carriers present in the base of the second BJT when it is switched off to the capacitor.

In the case of a Darlington configuration, the base drive current is applied to the base of the second BJT, which of course applies a base drive current to the first BJT. The base drive current for the second BJT (and hence, for the first BJT) can thus be controlled by the controllable current source. At a given collector output current a higher base drive current will result in an increased saturation of the bases of both the first and second BJTs. The amount of recovered charge is determined by the quantity of accumulated charge carriers in the bases of the first and the second bases BJTs. Only the base drive current for the second BJT has to be delivered by the driving circuit. The current for driving the base of the first BJT is provided via the second BJT. The total amount of regenerated base current therefore increases dramatically for slightly higher base drive currents.

The controllable current source is preferably powered by the supply voltage across the capacitor.

The electronic switching device may further comprise a bootstrap diode for providing current to the capacitor from an auxiliary power source during a start-up phase prior to establishment of the supply voltage.

The electronic switching device may further comprising a bleeder resistor for providing current to the capacitor from an auxiliary power source during a start-up phase prior to establishment of the supply voltage. The auxiliary power source is preferably a power supply coupled to the collector of the first BJT.

Preferably, the electronic switching device further comprises a switchable current source coupled between an auxiliary power source and the capacitor for providing current to the capacitor during a start-up phase prior to establishment of the supply voltage. The auxiliary power source is typically a power supply coupled to the collector of the first BJT.

The auxiliary power source may be a power supply coupled to the collector of the first BJT of another electronic switching device according to the invention, or the supply voltage established across the capacitor of another electronic switching device according to the invention.

In a preferred embodiment, the electronic switching circuit further comprises a monitoring circuit adapted to monitor the supply voltage on the capacitor and/or the saturation voltage of the first BJT during application of the base drive current and generate a control signal depending on the monitored voltage, the controllable current source being adapted to respond to the control signal by adjusting the base drive current.

Thus, the controllable current source can be controlled by measuring the supply voltage on the capacitor, where the recovered energy is stored. If the supply voltage is higher than a threshold value, the base drive current can be reduced until the supply voltage is within a desired voltage range.

Alternatively, the saturation voltage of the first BJT can be measured (for example, by monitoring the collector voltage of the first BJT during application of the base drive current). The base drive current can be increased if the measured saturation voltage is higher than a threshold value. At high collector voltages, the first BJT is almost operating outside the saturation region and will switch off quickly. However, a very limited quantity of charge carriers are accumulated in the base region of the first BJT, leading to little recovered energy. For generating enough recovered energy and to reduce the on-state voltage losses, the saturation voltage should remain below a predefined value.

An example of the invention will now be described in detail with reference to the accompanying drawing, FIG. 1, which shows a circuit of a half-bridge power converter comprising an electronic switching device according to the invention.

FIG. 1 shows part of a switched mode power supply (SMPS) based on a half bridge circuit. The circuit comprises two electronic switching devices according to the invention. Each of the electronic switching devices comprises a pair of high voltage bipolar junction transistors (BJTs) arranged in a Darlington configuration and a low voltage power MOSFET. In each case, the emitter of the Darlington pair is connected to the drain of the low voltage power MOSFET.

A SMPS controller 1 controls the switching of the two electronic switching devices by driving the gates of their respective MOSFETs with appropriate digital driving signals. The particular manner in which it drives the gates is not important for an understanding of the invention.

A first electronic switching device comprises a Darlington pair formed from high voltage BJTs 2a, 2b with the emitter of BJT 2a coupled to the drain of low voltage MOSFET 3. The source of MOSFET 3 is coupled to a first terminal (which in this instance is coupled to a resonant circuit) and the collector of the Darlington pair 2a, 2b is coupled to a second terminal to a power supply rail. In this case, NPN transistors have been used for the Darlington pair and an NMOS power MOSFET has been used. It is also possible to use PNP transistors and PMOS MOSFETs. Indeed, the MOSFET 3 could be replaced with any other kind of electronically actuable switch.

The base of the high voltage NPN transistor 2b is connected via current source 4 to a DC voltage source provided by capacitor 5. The voltage provided by capacitor 5 is not critical, but a value between 5V and 15V is generally preferred. MOSFET 5 should have a voltage rating at least equal to this voltage, as this is the maximum voltage which could be applied to the base of the BJT 2b. However, the high voltage BJTs 2a, 2b should have a voltage rating of at least the blocking voltage (i.e. the maximum difference in voltage that could appear between the collectors and emitters of BJTs 2a, 2b).

As mentioned above, the electronic switching device is switched on by driving the gate of MOSFET 3. When MOSFET 3 switches to a conductive state, the drain-source voltage is reduced very nearly to zero volts. The emitter voltage of the Darlington pair formed from BJTs 2a, 2b is therefore also reduced very nearly to zero volts. Thus, a current will flow from the base of BJT 2b through its emitter. The resulting emitter current of BJT 2b will flow into the base of BJT 2a and through the emitter of BJT 2a. This current causes both BJTs 2a, 2b to switch on.

When the MOSFET 3 is switched off its drain voltage will rise. The emitter voltages of BJTs 2a, 2b will also rise to a voltage close to values close to the voltages on their respective bases, causing them to cease conducting. When this happens, the excess charge carriers in the BJTs 2a, 2b will result in currents flowing from their collectors to their bases, which discharge excess charge in the base junctions. This current will flow as long as excess base charge is present. The value of the negative base currents is dictated by the actual collector currents at the moment of switch-off. The time that the negative base current flows for is determined by the amount of excess charge stored in the base during the conducting state and the properties of BJTs 2a, 2b; they will flow as long as required for the complete recombination of all free charge carriers in the base-collector junction of BJT 2a.

These currents caused by the excess charge carriers stored in the base junctions of BJTs 2a, 2b flow through diodes 6a, 6b to capacitor 5. The currents flowing into capacitor 5 cause the voltage across it to increase. A significant amount of negative base current can flow to capacitor 5, depending on the current that flowed through the base and through the collector during the previous active part of the cycle.

When MOSFET 3 is next switched on by controller 1, capacitor 5 supplies the base current for BJT 2b. The base current of BJT 2b is relatively small because the effective current gain of the Darlington pair formed by BJTs 2a, 2b is very high. Thus, a large collector current in BJT 2a can be caused to flow by a small base current in BJT 2b. The required base drive current for BJT 2b will be much smaller than the value of the average negative discharge base current of BJT 2a. This helps to ensure that there is adequate charge in capacitor 5 from the negative base currents that flow when BJTs 2a, 2b are switched off to provide the base current required to switch BJT 2b (and hence, BJT 2a) back on in a subsequent cycle. In practice, the average regenerated current of BJT 2a will be higher than the average required base drive current of BJT 2b when the duty cycle is up to about 50% and the DC current gain of BJT 2a is about 5 or higher. These values may vary depending on the component and circuit properties.

In addition, capacitor 5 can provide the supply current for the high-side switch driver part of controller 1.

As explained above, the value of the average negative discharge base current of BJT 2a will be larger than the required base drive current for BJT 2b. It is therefore possible that the voltage on capacitor 5 could exceed a desired value. Current source 4 operates to regulate this voltage so that it does not exceed the desired value by controlling the level of saturation of the BJTs 2a, 2b and hence the quantity of accumulated charge carriers in their bases.

To achieve this, controller 1 monitors the voltage on capacitor 5 and controls the current source 4 to operate at an appropriate current value to maintain the voltage on capacitor 5 at the desired value or within a desired range of values. By controlling the current provided by current source 4 when driving the base of BJT 2b, the total quantity of accumulated charge carriers in BJTs 2a, 2b is controlled. This in turn controls the negative discharge base current that flows from BTJs 2a, 2b to capacitor 5 when the BJTs 2a, 2b are switched off, and thus the voltage on capacitor 5 is controlled.

If controller 1 detects that the voltage on capacitor 5 has exceeded the upper threshold of a desired range, it will decrease the base drive current provided by current source 4 to reduce the total quantity of accumulated charge carriers in the bases of BJTs 2a, 2b, which in turn reduces the voltage across capacitor 5. Conversely, if controller 1 detects that the voltage on capacitor 5 has fallen below the lower threshold of a desired range, it will increase the base drive current provided by current source 4 to increase the total quantity of accumulated charge carriers in the bases of BJTs 2a, 2b, which in turn increases the voltage across capacitor 5.

Since the configuration shown in FIG. 1 is a half-bridge, there is also provided an electronic switching device according to the invention for low-side switching. This comprises BJTs 7a, 7b arranged in a Darlington configuration, MOSFET 8, current source 9, diodes 10a, 10b, and capacitor 11. It is identical to the electronic switching device already described above for high-side switching and so it will not be described further.

To provide an initial charge in capacitors 5 and 11 so that the electronic switching devices can start operating, capacitors 5 and 11 can be supplied with current via bleeder resistors coupled between each of capacitors 5 and 11 and the respective collectors of BJT 2a and BJT 7a. One problem with using bleeder resistors is that permanent power dissipation results, even during normal operation. A preferred embodiment therefore makes use of current sources coupled from the collector of BJT 2a to capacitor 5 and from the collector of BJT 7a to capacitor 11. Once the voltages on capacitors 5 and 11 have exceeded an under-voltage lockout level, the current sources can be disabled to prevent unnecessary power dissipation.

The electronic switching device described above finds applications in many areas, including: flyback mains adapters; flyback LED driver power supplies (for both integrated and non-integrated LED lamps); switch mode power supplies using half-bridge switching circuits (for example, for fluorescent and other lamp drivers), LLC style power supplies using half-bridges for adapters and integrated supplies, and any other switch mode power supply or switching application where high voltage switching, for example at >400V, is required.

In the embodiment of FIG. 1, emitter switching has been used for BJTs 2a and 7a, but it is possible to make use of other switching arrangements whilst benefitting from the advantages of the invention.

Other variations to the disclosed embodiments can be understood and effected by those skilled in the art in practising the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

The invention claimed is:

1. An electronic switching device comprising:
a first bipolar junction transistor adapted to control a flow of current between a pair of switching terminals;
a second bipolar junction transistor coupled with the first bipolar junction transistor to form a Darlington pair;
a charge recovery circuit coupled to a base of the first bipolar junction transistor and adapted to establish a supply voltage across a capacitor by storing in the capacitor charge carriers accumulated in the base of the first bipolar junction transistor during application of a base drive current, a quantity of accumulated charge carriers depending on the base drive current;
the charge recovery circuit further including a second diode coupled to conduct accumulated charge carriers from a base of the second bipolar junction transistor when it is switched off to the capacitor; and
a controllable current source adapted to control the base drive current, thereby controlling the supply voltage, the controllable current source coupled between the capacitor and the base of the second bipolar junction transistor.

2. An electronic switching device according to claim 1, further comprising a MOSFET coupled in series with the first bipolar junction transistor between the pair of switching terminals.

3. An electronic switching device according to claim 2, wherein a drain of the MOSFET is coupled to an emitter of the first bipolar junction transistor, and a collector of the first bipolar junction transistor and a source of the MOSFET are connected to respective ones of the pair of switching terminals.

4. An electronic switching device according to claim 2, wherein a control terminal is coupled to a gate of the MOSFET only, the control terminal being suitable for receiving a control signal for operating the electronic switching device.

5. An electronic device according to claim 1, wherein the charge recovery circuit comprises a first diode coupled to conduct accumulated charge carriers from a base of the first bipolar junction transistor when it is switched off to the capacitor.

6. An electronic device according to claim 1, wherein the controllable current source is powered by the supply voltage across the capacitor.

7. An electronic switching device according to claim 1, further comprising a power supply for providing current to the capacitor during a start-up phase prior to establishment of the supply voltage.

8. An electronic switching device according to claim 7, wherein the power supply is coupled to a collector of the first bipolar junction transistor.

9. An electronic switching device according to claim 1, further comprising a monitoring circuit adapted to monitor at least one of the supply voltage on the capacitor and the saturation voltage of the first bipolar junction transistor during application of the base drive current and generate a control signal depending on the monitored voltage, the controllable current source being adapted to respond to the control signal by adjusting the base drive current.

10. An electronic switching device according to claim 9, wherein the monitoring circuit is configured to:

reduce the voltage across the capacitor by decreasing the base drive current provided by the current source to reduce the total quantity of accumulated charge carriers in the bases of the first bipolar junction transistor and of the second bipolar junction transistor if a voltage across the capacitor has exceeded an upper threshold of a desired range; and increase the voltage across the capacitor by increasing the base drive current provided by the current source to increase the total quantity of accumulated charge carriers in the bases of the first bipolar junction transistor and of the second bipolar junction transistor if the voltage across the capacitor has fallen below a lower threshold of the desired range.

11. An electronic switching device according to claim 1, wherein the controllable current source is configured to control the accumulated charge carriers in the first bipolar junction transistor and in the second bipolar junction transistor by controlling the current for driving the base of the first bipolar junction transistor and of the second bipolar junction transistor.

* * * * *